United States Patent [19]
Kim et al.

[11] Patent Number: 5,835,444
[45] Date of Patent: Nov. 10, 1998

[54] METHOD FOR CONTROLLING DATA OUTPUT BUFFER FOR USE IN OPERATION AT HIGH FREQUENCY OF SYNCHRONOUS MEMORY

[75] Inventors: Gyu-Hong Kim, Seoul; Woo-Seop Jeong, Kyungki-do, both of Rep. of Korea

[73] Assignee: Samsung Electronics, Co., Ltd., Suwon, Rep. of Korea

[21] Appl. No.: 712,346

[22] Filed: Sep. 11, 1996

[30] Foreign Application Priority Data

Sep. 11, 1995 [KR] Rep. of Korea ............... 1995 29568

[51] Int. Cl.$^6$ ..................................... G11C 7/00
[52] U.S. Cl. ........................ 365/233; 365/189.05
[58] Field of Search ................. 365/233, 189.05, 365/194; 327/141, 201, 210, 211, 214, 218

[56] References Cited

U.S. PATENT DOCUMENTS

| | | | |
|---|---|---|---|
| 5,324,993 | 6/1994 | Ikawa | 327/141 |
| 5,384,750 | 1/1995 | Lee | 365/233 |
| 5,402,388 | 3/1995 | Wojcicki et al. | 365/189.05 |
| 5,535,171 | 7/1996 | Kim et al. | 365/189.05 |

*Primary Examiner*—Son T. Dinh
*Attorney, Agent, or Firm*—Marger, Johnson, McCollom & Stolowitz P.C.

[57] ABSTRACT

Methods and apparatus for controlling output buffer circuitry in a synchronous semiconductor memory device. An internal clock signal is generated and logic provided to provide a control signal that enables that output buffer circuitry for a read operation. An internal clock signal is generated synchronized to the external or system clock signal. An intermediate control signal is triggered by the internal clock signal at a selected number of cycles less than the memory latency period after a read command, and then the control signal for enabling the output buffer is asserted on a subsequent cycle of the internal clock signal, thereby ensuring at least a predetermined minimum time for the output buffer control signal to propagate through the memory device before data is transferred out of the device.

2 Claims, 4 Drawing Sheets

5,835,444

METHOD FOR CONTROLLING DATA OUTPUT BUFFER FOR USE IN OPERATION AT HIGH FREQUENCY OF SYNCHRONOUS MEMORY

BACKGROUND OF THE INVENTION

1. Field of the Invention

The present invention relates to a semiconductor memory device and, in particular, to a method for controlling a data output buffer of a synchronous memory which supplies a control signal to a data output buffer by using a clock of a predetermined period applied in the exterior of the above memory.

The present application for a method for controlling a data output buffer of a synchronous memory which supplies a control signal to a data output buffer by using a clock of a predetermined period applied in the exterior of the above memory, is based on Korean Application No. 29568/1995 which is incorporated herein by reference for all purposes.

2. Description of the Related Art

In general, a computer system is largely divided into a central processing unit (hereinafter, referred to as CPU) for performing commands on given works and a memory device for storing data, program and the like, in response to the commands of the CPU. As noted beforehand, the operation speed of the memory device is relatively still lower than that of the CPU. Thus, in order to improve the performance of the computer system, it is required that the access time of the memory device should be reduced as much as possible, so that the CPU can operate without stand-by time in addition to the increment of the operation speed of the CPU. For the sake of meeting the above requirement, there is an attempt to operate the memory device at a high speed with mounting an internal clock generating circuit which operates in synchronism with the clock of the system. Herein, the above memory device is specifically referred to as a synchronous memory. In such a synchronous memory wherein there are a row address and a column address latched by activation of a row address strobe signal and a column address strobe signal, information resident in a designated memory position is outputted through a data output buffer. At this time, the minimum time from the activation of the row address strobe signal (hereinafter, referred to as )and the column address strobe signal (hereinafter, referred to as) to output of the data is generally called as a CAS latency and an RAS latency, respectively. As above, the CAS latency and RAS latency are represented as original values thereof for determining the characteristic of the memory device.

FIG. 1 is a circuit diagram illustrating a general data output buffer used in a synchronous memory, and FIG. 2 is a diagram illustrating a circuit for controlling a data output buffer according to an embodiment of the prior art.

The construction of FIG. 1 is well-known to one skilled in the art and, more particularly, in detail disclosed in the Korea Patent Application No. 1992-18132 filed by the same assignee, SAMSUNG Electronics Ltd., as in the present invention.

With regard to FIG. 2, four transfer gates 50,60,70, and 80 which input a clock signal CLOCK and an inverting clock signal to control electrodes are in series connected with one another, and output terminals of the above transfer gates 50, 60, 70, and 80 are connected with four latch circuits 52,62, 72, and 82, respectively. An input signal INPUT is inputted to an input terminal of the transfer gate 50. An output terminal of the latch circuit 62 is connected with an input terminal of the transfer gate 90 and a control electrode of the transfer gate 90 is connected with a 2 clock latency signal CL2 and an inverting 2 clock latency signal. An output terminal of the latch circuit 82 is connected with an input terminal of the transfer gate 100, and a 3 clock latency signal CL3 and an inverting 3 clock latency signal are connected with a control electrode of the transfer gate 100. Output terminals of the transfer gates 90 and 100 are connected with each other, to be coupled with an input terminal of a delay circuit 10, and a control signal PTRST is outputted from an output terminal of the delay circuit 110.

FIG. 3 is a timing diagram illustrating the output operations of FIGS. 1 and 2. With reference to FIGS. 1 to 3, an explanation on the operation of the circuit for controlling the data output buffer according to the prior art will in detail be given hereinafter.

As can be seen in FIG. 3, the CAS latency in the circuit diagrams of FIGS. 1 and 2 is set as 3. That is, it is not until 3 clock after the column address strobe signal is enabled that the circuit of FIG. 3 fetches the data from the exterior of the circuit. As shown in FIG. 3, for the sake of fetching the data in 3 clocks, the data output buffer should be driven by 2 clocks as shown in FIG. 3 and the data should previously be fetched prior to 3 clock. In FIG. 1, the clock signal CLOCK receives a valid input in a logic "high" interval, thereby storing the data at the latch unit and outputting the stored data to the exterior thereof, at the same time. As well, the data stored at the latch unit is maintained intact until a next clock goes to the logic "high" state, so that the data can move in synchronism with an external system clock. In FIG. 1, DOi and are designated as the data outputted from the memory cell and PTRST is designated as the control signal for enabling the data output buffer. Upon read operation, the control signal PTRST stays at the logic "high" state and thus, the data output buffer is enabled. On the other hand, upon write operation, the control signal PTRST stays at the logic "low" state and thus, the data output buffer is disabled. Also, the control signal PTRST is synchronized to an external clock signal. As indicated above, since the CAS latency is beforehand set, the control signal PTRST as well as the CAS latency should operate in conformity with a proper timing so that the data can be outputted in consistency with the preset CAS latency.

Referring to FIG. 2 which generates the control signal PTRST, it is possible to change the CAS latency in accordance with various modes of the synchronous memory. Accordingly, as depicted in FIG. 2, there is a unit for counting the number of the clocks after applying an read command to perform operation corresponding to the CAS latency. In the control circuit as shown in FIG. 2, the time when the control signal PTRST is generated is later by 1 clock than the time when the read command is applied. Hence, as can be seen in timing diagram of FIG. 3, time tSAC can be determined by the control signal PTRST. Namely, now that the clock generating the control signal PTRST and the clock driving the data output buffer are equal to each other and thus, the control signal PTRST is started from the clock, the output can be considerably lately determined time.

FIG. 4 is a diagram illustrating a circuit for controlling a data output buffer according to another embodiment of the prior art, and FIG. 5 is a timing diagram illustrating the output operations of FIGS. 1 and 4.

In the case in FIG. 2 that the CAS latency is set as 3, the control signal PTRST which is generally generated in synchronism with a second clock after applying the read commend, should be generated in synchronism with a falling edge of a first clock, thereby compensating the time delay to arrive at the data output buffer by means of the line loading and the gate delay of the above control signal PTRST. Further, the control signal PTRST should be enabled before the second clock goes to the logic "high" state, so that the time tSAC can be prevented from being delayed.

On the other hand, when the operation frequency becomes higher and higher, the prior art as depicted in FIG. 4 has an influence on the time tSAC. That is, the line loading of the control signal PTRST is increased as well as the time taken for reaching the data output buffer of the control signal PTRST is delayed by way of the size of the semiconductor memory device and various conditions thereof, thereby generating following problems. Namely, when the logic "low" interval of the clock is less than the time when the control signal PTRST is generated from a falling edge of the logic "low" signal of the clock to the data output buffer, since the data can be outputted by receipt of the control signal PTRST, the output of the data is delayed as much as the delay of the control signal PTRST.

SUMMARY OF THE INVENTION

It is therefore an object of the present invention to provide a method for controlling a data output buffer of a synchronous memory which adaptively operates at a high frequency.

The above object can be achieved according to the principles of the present invention with a method for controlling a data output buffer in a semiconductor memory device which generates an internal clock of an auto pulse format having a predetermined width by receiving a system clock of the determined period supplied from the exterior and which operates in synchronism with the internal clock, wherein a control signal for enabling the data output buffer is synchronized and enabled prior by a given clock to a clock for synchronizing the data output buffer, in the event that the data output buffer for outputting the data from an interior of the memory to the exterior thereof can designate a data output time, by means of synchronism of the clock, thereby controlling the data output buffer after passing the data output buffer control signal through a given delay element.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar elements components, wherein.

DETAILED DESCRIPTION OF THE PREFERRED EMBODIMENTS

Figure 1:
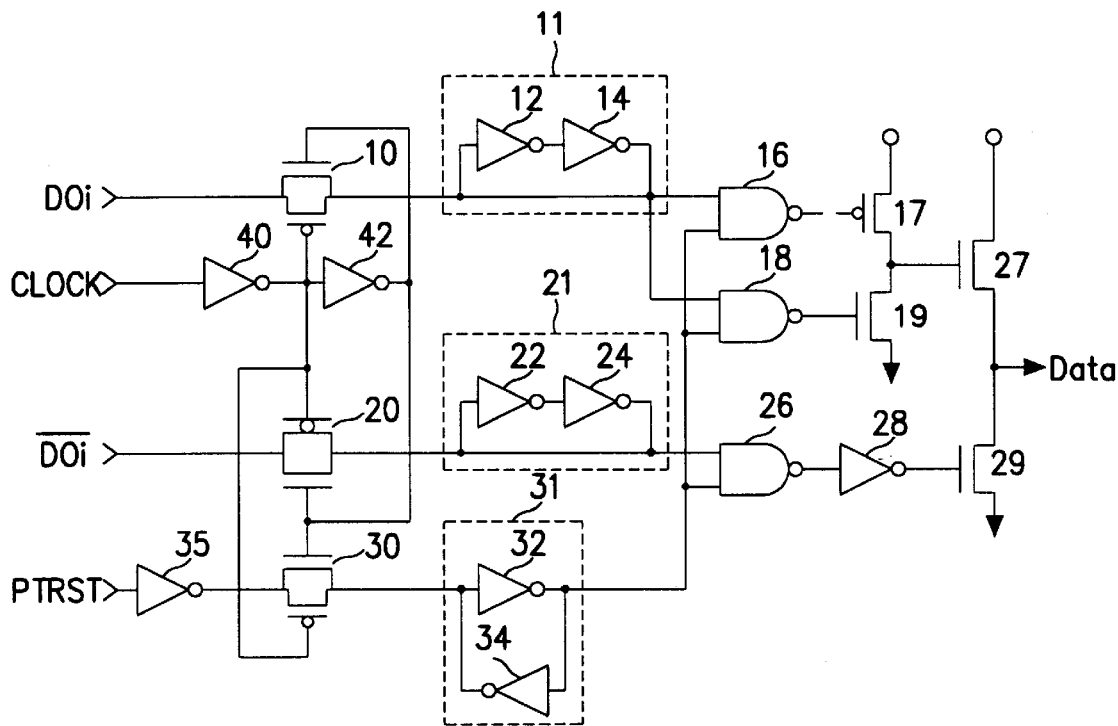
FIG. 1 is a circuit diagram illustrating a general data output buffer used in a synchronous memory.
Figure 2:
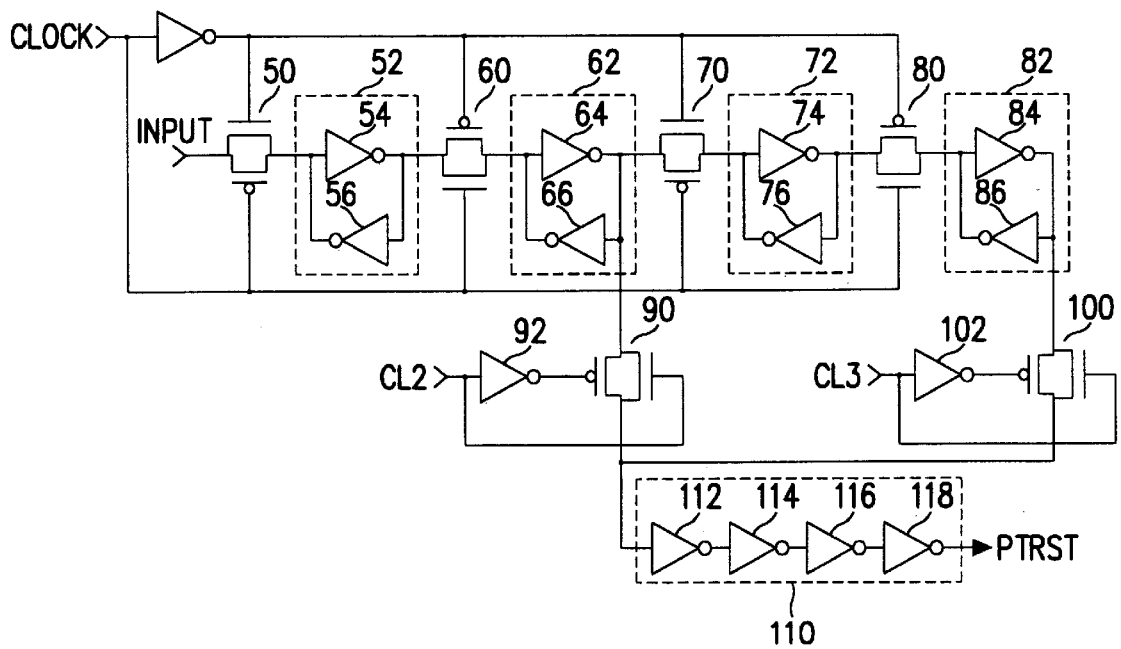
FIG. 2 is a diagram illustrating a circuit for controlling a data output buffer according to an embodiment of the prior art.
Figure 3:
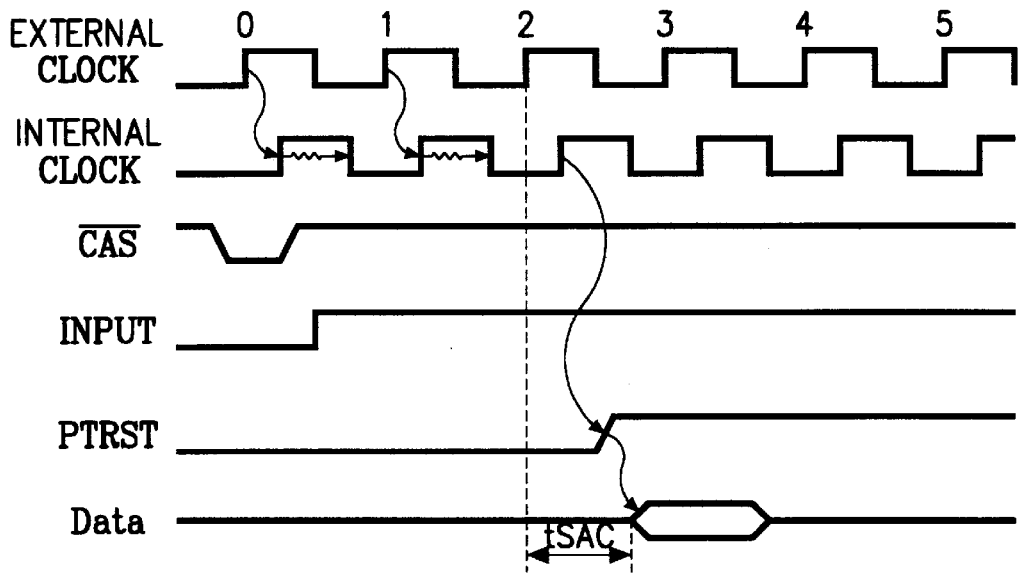
FIG. 3 is a timing diagram illustrating the output operations of FIGS. 1 and 2.

Throughout the drawings, it is noted that the same reference numerals of letter will be used to designate like or equivalent elements having the same function. Further, in the following description, numeral specific details are set forth to provide a more thorough understanding of the present invention. It will be apparent, however, to one skilled in the art that the present invention may be practiced without these specific details. The detailed description on known function and constructions unnecessarily obscuring the subject matter of the present invention will be avoided in the present invention.

Figure 6:
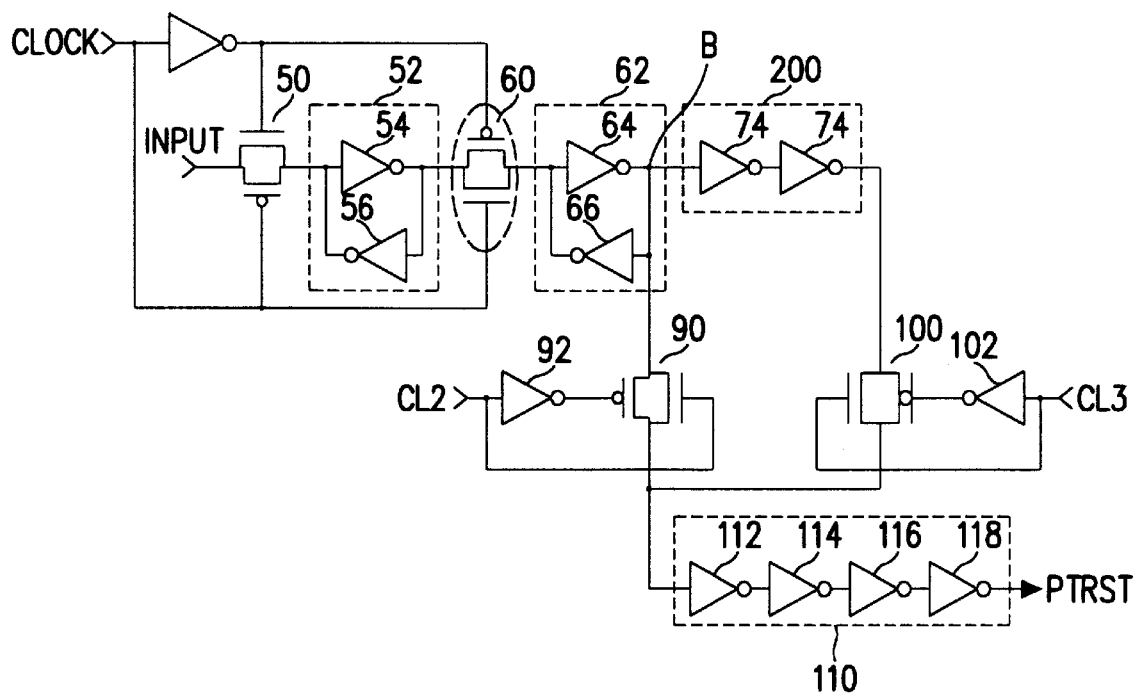
FIG. 6 is a diagram illustrating a circuit for controlling a data output buffer according to an embodiment of the present invention.
Figure 7:
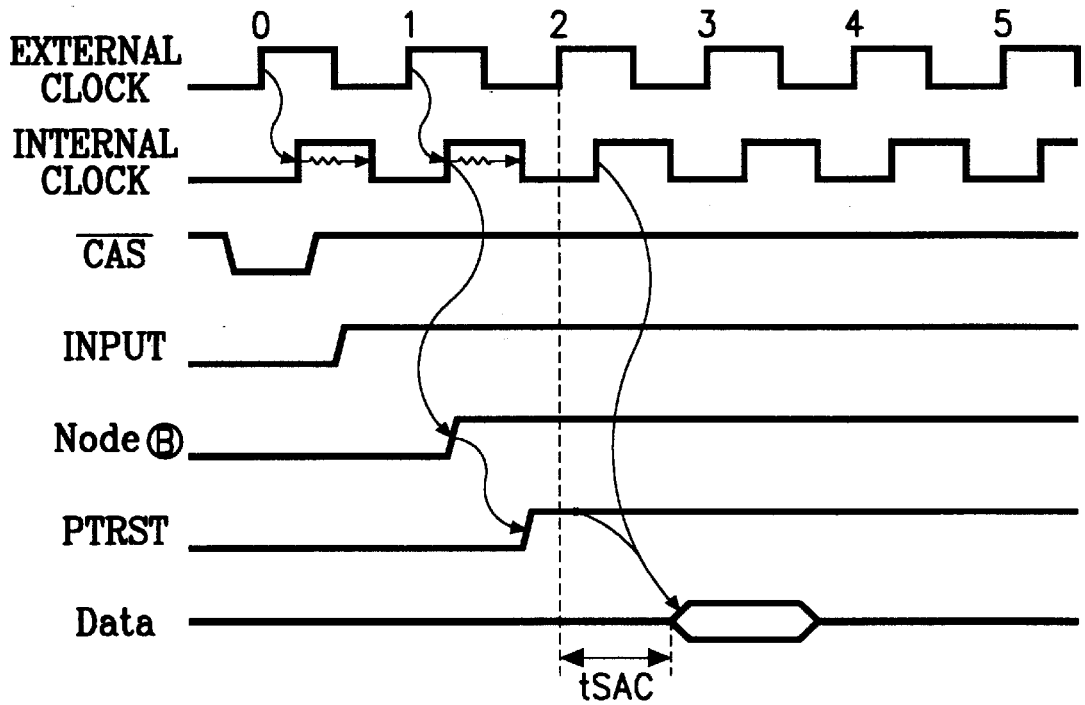
FIG. 7 is a timing diagram illustrating the output operations of FIGS. 1 and 6.

FIG. 6 is a diagram illustrating a data output buffer control circuit according to an embodiment of the present invention, and FIG. 7 is a timing diagram illustrating the output operations of FIGS. 1 and 6.

As illustrated in FIG. 6, one principal characteristic of a control signal generating circuit is that the control signal PTRST is generated in synchronism with the clock prior by one clock to the predetermined CAS latency. As always, if the control signal PTRST is generated prior by one clock to the CAS latency, the control signal PTRST in the data output buffer goes to the logic "high" interval of the clock, so that the data can beforehand be outputted. Thus, the data can not be outputted to the exterior in dependence with the CAS latency. Accordingly, another principal characteristic thereof is to use a delay element. While such a delay element is generated prior by one clock to the control signal PTRST in synchronism with the clock, it is not until the clock controlling the data output buffer goes to the logic "low" interval that the control signal PTRST can reach the data output buffer. Once the CAS latency is set to 3 as can be seen in FIGS. 6 and 7 and the column address strobe signal is enabled in the 0'th clock to apply the read command, the transfer gate 60 as indicated in FIG. 6 is open in the first clock, thereby enabling the output terminal of the latch circuit 62 to the logic "high" state. When the output terminal of the latch circuit 62 goes to the logic "high" state, the control signal PTRST is generated through the delay element 200 after the proper time so that the control signal PTRST can reach the data output buffer through the gate delay for the buffering and line loading thus to reach the data output buffer. The clock for controlling the data output buffer upon reaching the control signal PTRST to the data output buffer previously stays at the logic "low" state. Therefore, the data has not yet be transmitted to the exterior. After that, the clock again goes to the logic "high" state, the transfer gates of the data output buffer is open, the data transmitted at the memory cell is stored at the latch unit, and the data is outputted to the exterior. The data which is once stored at the latch unit can not be changed until the next clock, and thus the data is maintained during one clock.

As stated above, the effect of the present invention and the prior art will be in detail given hereinafter.

If the frequency becomes high and the time required for reaching the data output buffer from the time when the control signal PTRST is generated, is constant, the time tSAC required for reaching the data outputted from the second clock according to the prior art is different from that according to the present invention. In other words, since the control signal PTRST lately reaches the data output buffer according to the prior art, that is to say, since the control signal PTRST reaches the data output buffer after the clock goes to the logic "high" state, the time tSAC is determined depending on the control signal PTRST. However, now that the control signal PTRST reaches the data output buffer before the clock goes to the logic "high" state according to the present invention, the time tSAC is determined from the time when the clock goes to the logic "high" state.

Figure 4:
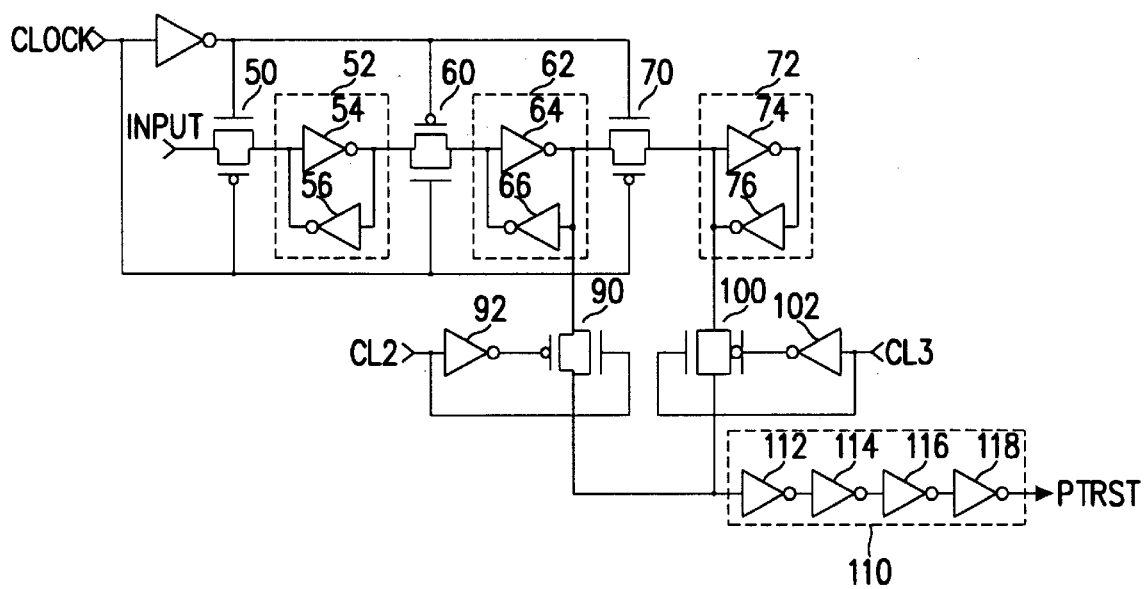
FIG. 4 is a diagram illustrating a circuit for controlling a data output buffer according to another embodiment of the prior art.
Figure 5:
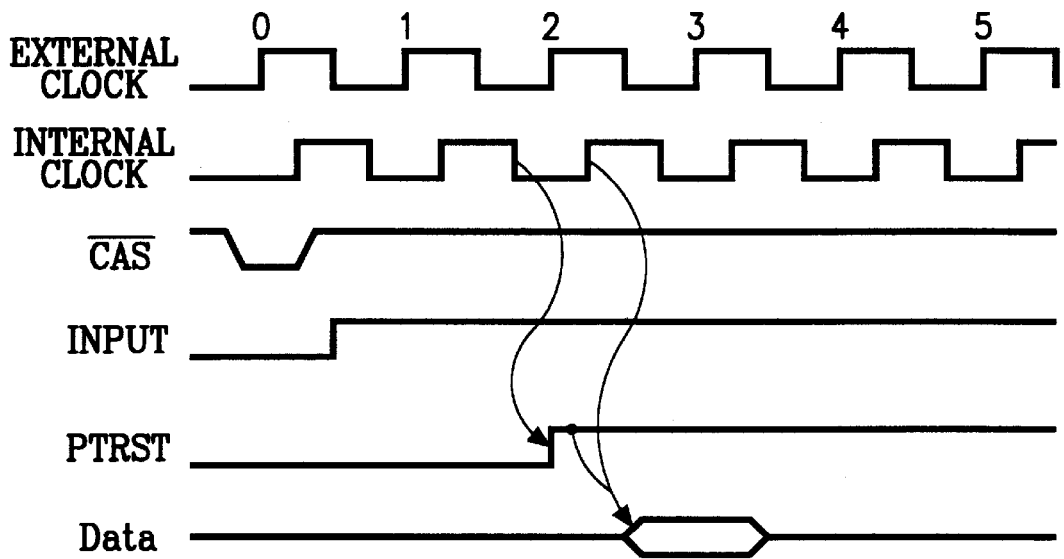
FIG. 5 is a timing diagram illustrating the output operations of FIGS. 1 and 4.
Figure 8:
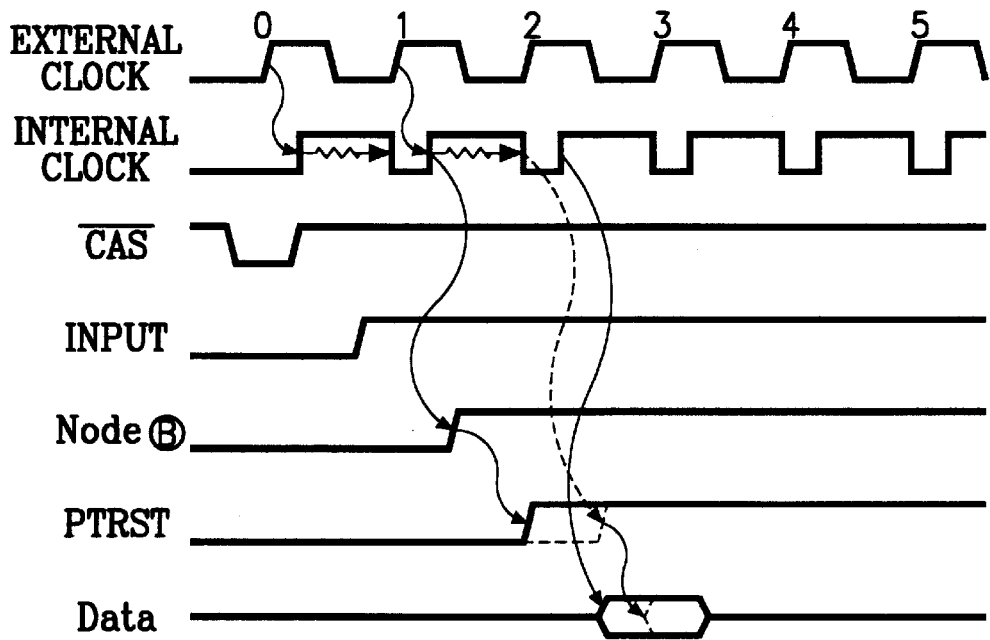
FIG. 8 is a waveform illustrating comparison of the output timings of FIGS. 4 and 6.

FIG. 8 is a waveform illustrating comparison of the output timings of FIGS. 4 and 6, wherein the operation waveform is shown with the dotted line.

As may be apparent from the foregoing, the method for controlling the data output buffer can optimally ensure the speed of the output data in the synchronous memory by adapting the present invention even when the operation frequency is high.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiment discloses as the best mode contemplated for carrying out the present invention, but that the present invention includes all embodiments falling within the scope of the appended claims.

We claim:

1. A method for controlling a data output buffer of a synchronous semiconductor memory device for high speed operation wherein the memory has a read latency period of a predetermined number of clock cycles, the method comprising the steps of:

receiving a periodic system clock signal having at least a predetermined period;

generating an internal clock signal synchronized to the system clock signal;

asserting an intermediate control signal upon a rising edge of the internal clock signal at a time equal to a selected number of clock cycles less than the said latency period after a read command; and then generating a control signal for enabling the output buffer upon the rising edge of a next subsequent cycle of the internal clock signal, thereby ensuring at least a predetermined minimum time for the output buffer enabling control signal to propagate through the memory before data is transferred out of the memory device.

2. A method according to claim 1 wherein the selected number of clock cycles is one clock cycle.

* * * * *